United States Patent
Aoki et al.

(10) Patent No.: US 7,755,898 B2
(45) Date of Patent: Jul. 13, 2010

(54) SEMICONDUCTOR MODULE AND INVERTER DEVICE

(75) Inventors: Kazuo Aoki, Anjo (JP); Junji Tsuruoka, Anjo (JP); Seiji Yasui, Nagoya (JP)

(73) Assignee: Aisin AW Co., Ltd., Anjo (JP)

( * ) Notice: Subject to any disclaimer, the term of this patent is extended or adjusted under 35 U.S.C. 154(b) by 231 days.

(21) Appl. No.: 12/078,162

(22) Filed: Mar. 27, 2008

(65) Prior Publication Data

US 2008/0291710 A1  Nov. 27, 2008

(30) Foreign Application Priority Data

May 22, 2007  (JP) .............................. 2007-135681

(51) Int. Cl.
*H05K 7/20* (2006.01)
(52) U.S. Cl. .................... 361/710; 361/699; 361/702
(58) Field of Classification Search .................. 361/710, 361/699, 702
See application file for complete search history.

(56) References Cited

U.S. PATENT DOCUMENTS

| 5,966,291 | A |  | 10/1999 | Baumel et al. |
| 6,166,937 | A | * | 12/2000 | Yamamura et al. ........... 363/141 |
| 6,961,244 | B2 | * | 11/2005 | Tsuchiya et al. ............. 361/710 |
| 7,030,520 | B2 | * | 4/2006 | Takenaka et al. .............. 310/64 |
| 7,095,613 | B2 | * | 8/2006 | Tsuchiya et al. ............. 361/699 |
| 7,525,224 | B2 | * | 4/2009 | Takenaka et al. .............. 310/54 |
| 2001/0014029 | A1 |  | 8/2001 | Suzuki et al. |
| 2003/0053298 | A1 | * | 3/2003 | Yamada et al. ............... 361/728 |

FOREIGN PATENT DOCUMENTS

| JP | A 10-178151 | 6/1998 |
| JP | A 2001-308246 | 11/2001 |
| JP | A 2001-339020 | 12/2001 |
| JP | A 2004-103936 | 4/2004 |
| JP | A-2004-349324 | 12/2004 |
| JP | A 2005-191502 | 7/2005 |

* cited by examiner

*Primary Examiner*—Bao Q Vu
(74) *Attorney, Agent, or Firm*—Oliff & Berridge, PLC

(57) ABSTRACT

A semiconductor module includes a base plate; a plurality of substrates placed on one surface of the base plate, with each substrate of the plurality of substrates including a switching element, a diode element, and a connection terminal area; and a parallel flow forming device that forms parallel coolant flow paths that are provided so as to be in contact with the other.

20 Claims, 10 Drawing Sheets

F I G . 5
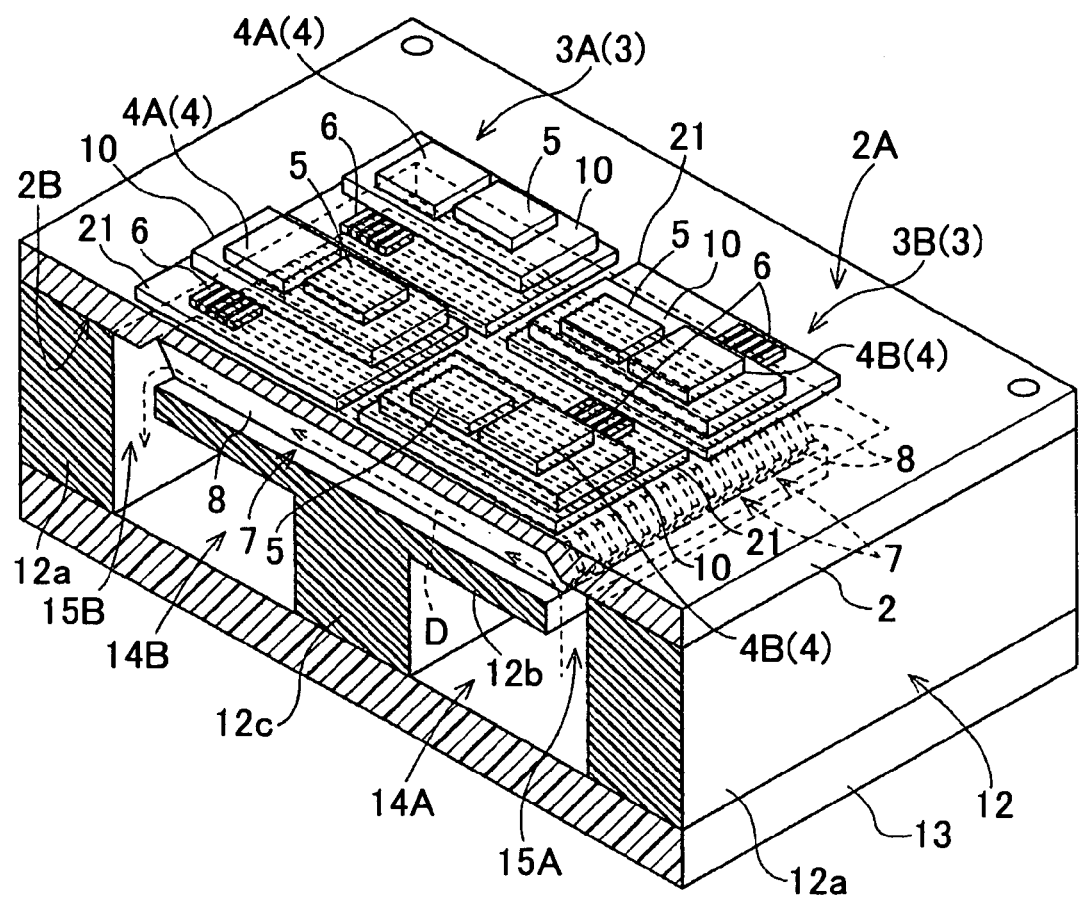

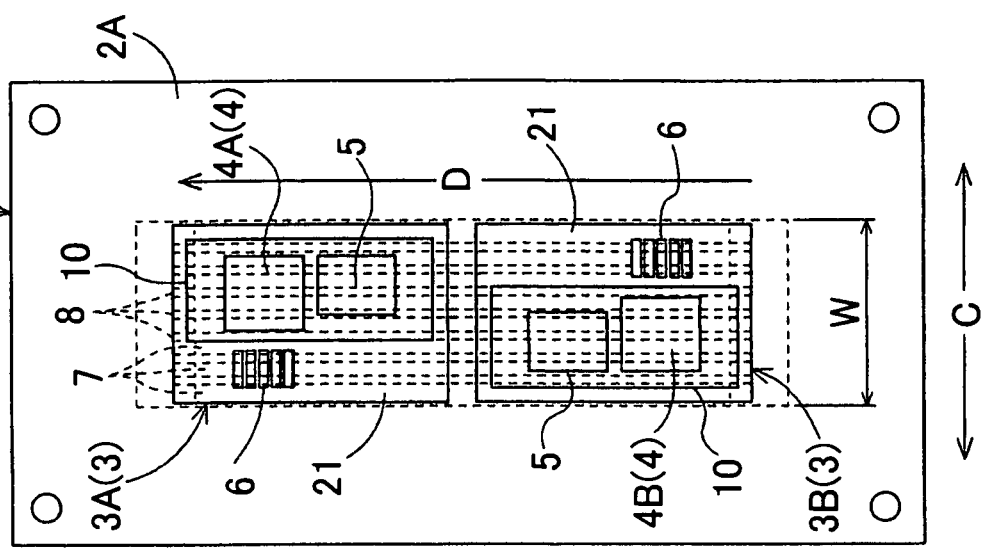
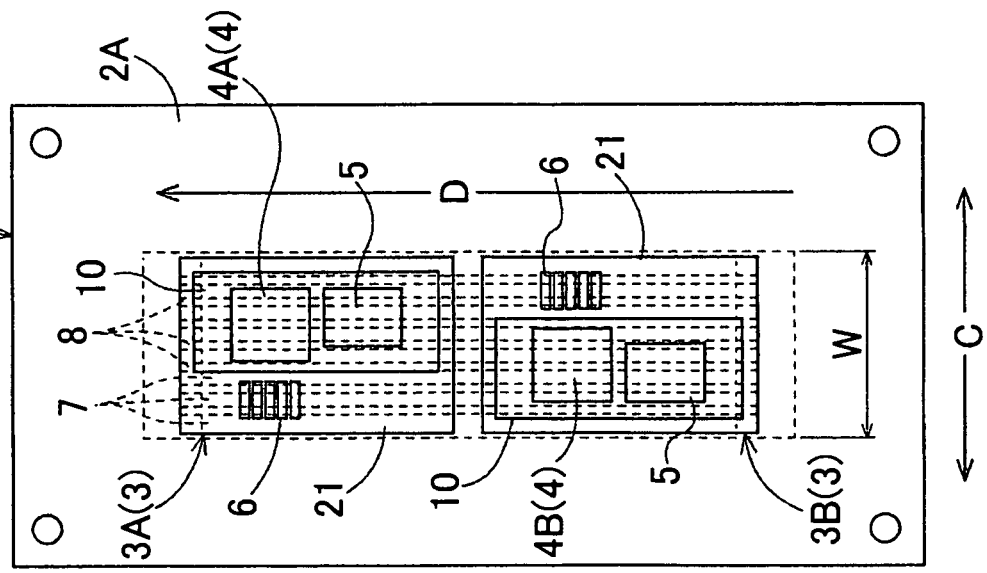

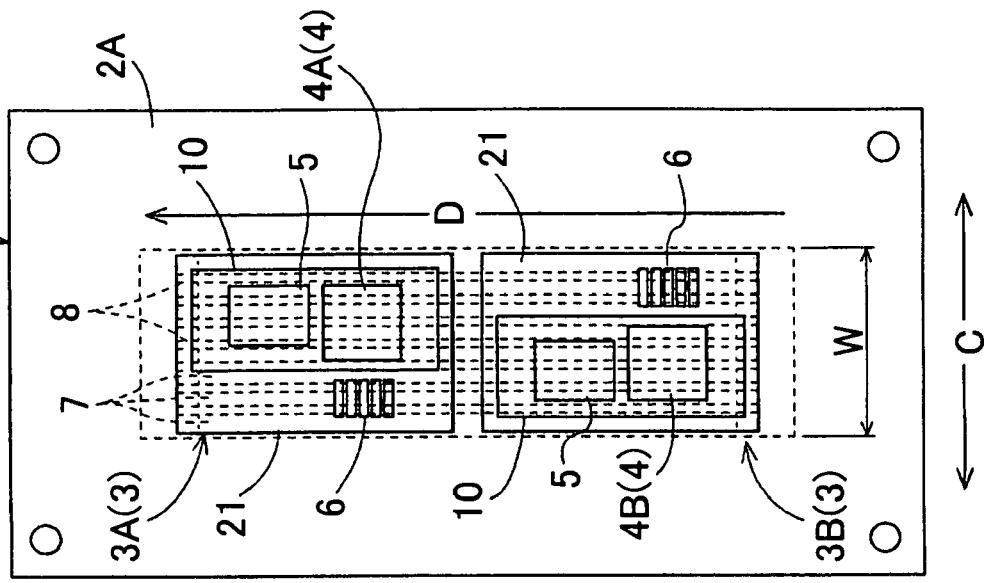
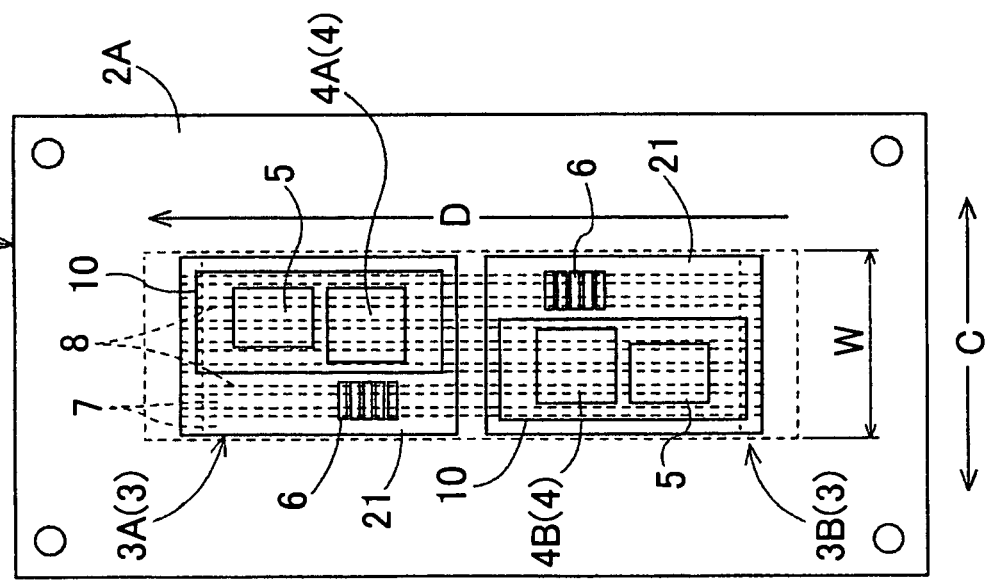

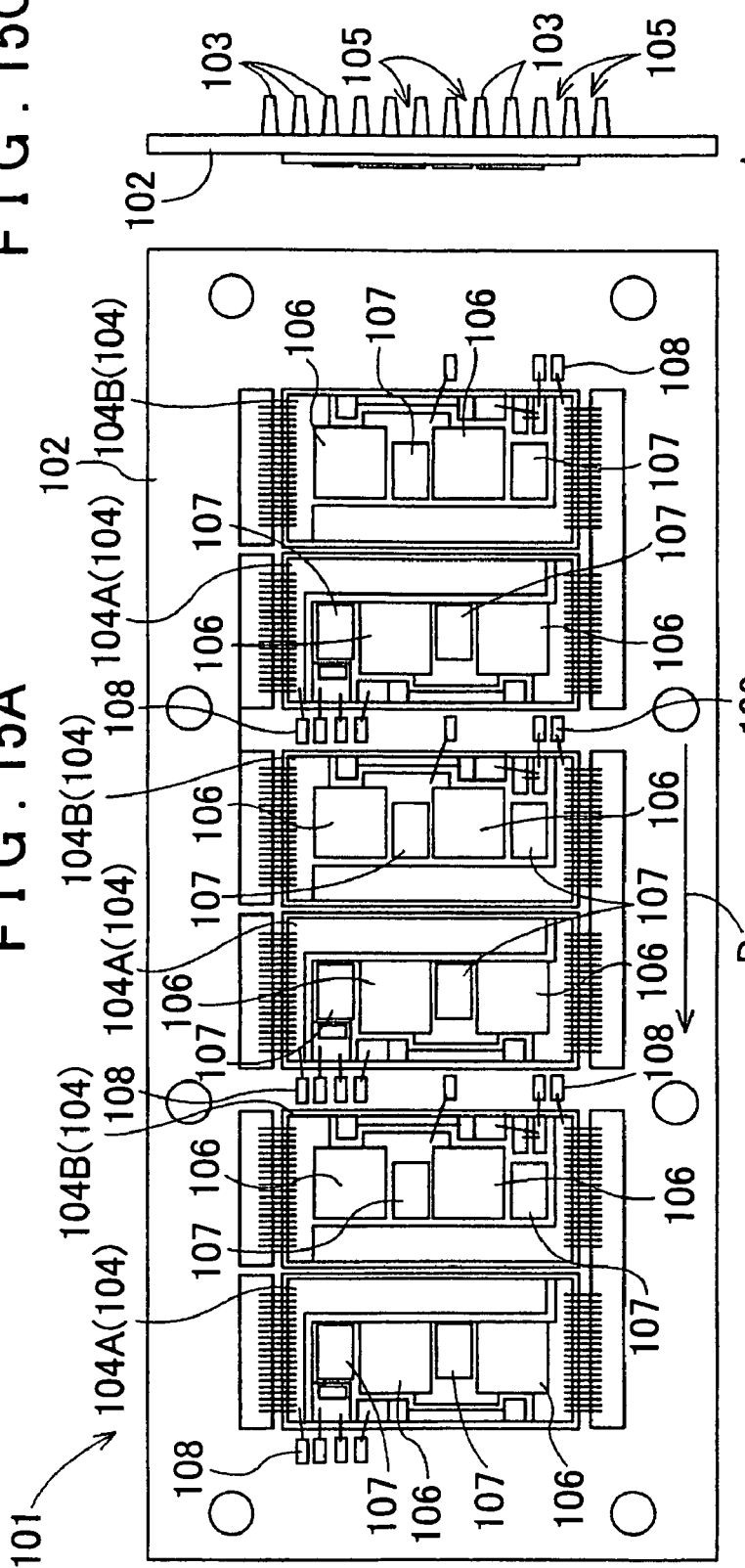

SEMICONDUCTOR MODULE AND INVERTER DEVICE

CROSS-REFERENCE TO RELATED APPLICATION

The disclosure of Japanese Patent Application No. 2007-135681 filed on May 22, 2007 including the specification, drawings and abstract is incorporated herein by reference in its entirety.

BACKGROUND

The present invention relates to a semiconductor module and an inverter device.

There exists an inverter circuit for driving an electric machine of a hybrid vehicle, an electrical vehicle, or the like. A semiconductor module, which includes switching elements that structure the inverter circuit, generates a large amount of heat, and furthermore, requires downsizing. To attain this, frequently a water-cooled system is used as a cooling structure for the semiconductor module. As an example of a structure for such a water-cooled system, Japanese Patent Application JP-A-2004-349324 (pages 6 and 7, and FIG. 5) discloses the structure that is shown in FIGS. 15A, 15B, and 15C. In this figure, FIG. 15A is a plane view, FIG. 15B is a side view, and FIG. 15C is a front view. The semiconductor module 101 that is shown in this figure is provided with a base plate 102 having stripe-shaped fins 103 formed on the back surface thereof and six substrates 104 that are mounted on the upper surface thereof. In addition, on the lower surface of the base plate 102, a water path cover (not illustrated) is provided so as to be in contact with the bottom surface of the fins 103 (the surface below the fins 103 in FIG. 15B), and thereby, respective water flow paths 105 are formed between the plurality of fins 103. Therefore, in this semiconductor module 101, the coolant flow direction D is in the longitudinal direction (the left to right direction in FIG. 15B) of the base plate 102. In addition, the six substrates 104 that are mounted on the base plate 102 are disposed in a row in the coolant flow direction D.

In addition, two elements, that is, IGBTs (Insulated Gate Bipolar Transistor), which serve as switching elements 106, and diode elements 107, are arranged in each of the substrates 104. In addition, connection terminal areas 108, where the wire bonding for electrically connecting the elements 106 and 107 on each of the substrates 104 with a control substrate (not illustrated) is carried out, is disposed adjacent to each of the substrates 104. In addition, on these substrates 104, one each of two switching elements 106 and two diode elements 107 are disposed so as to be alternately arranged side-by-side in a direction that is perpendicular to the coolant flow direction D. In addition, the connecting terminal areas 108 are arranged in the sides that are opposite to the sides at which a pair of substrates 104A and 104B faces each other in the coolant flow direction D.

SUMMARY

In the structure of the semiconductor module that is shown in FIGS. 15A, 15B, and 15C described above, all of the six substrates 104 are disposed in series in the coolant flow direction D. Thus, a structure is used in which the flow of the same coolant, which flows through each of the coolant flow paths 105 that are formed between the plurality of fins 103, cools in sequence a plurality (at least three) of the switching elements 106. Thereby, there is a problem in that the temperature of the coolant that flows through each of the coolant flow paths 105 gradually increases, and the cooling performance for the switching elements 106 on the downstream side decreases.

In addition, Japanese Patent Application JP-A-2004-349324 only discloses a structure in which the switching elements 106 and the diode elements 107 on each of the substrates 104 are disposed so as to be arranged alternately in a direction that is perpendicular to the coolant flow direction D, while a structure in which the switching elements 106 and the diode elements 107 of each of the substrates 104 are arranged in series in the flow direction of the coolant is not disclosed. In addition, conventionally, in relation to structures in which the switching elements 106 and the diode elements 107 of each of the substrates 104 of the semiconductor modules are disposed in series in the coolant flow direction, a cooling structure for appropriately cooling each of the elements 106 and 107 was not known.

In relation to a structure in which the switching elements and diode elements on a plurality of substrates are disposed in series in the flow direction of a coolant, the present invention provides a semiconductor module that is provided with a structure in which all of the switching elements of a substrate can be appropriately cooled, and an inverter device. The present invention can also achieve various other advantages.

According to an exemplary aspect of the invention, a semiconductor module includes a base plate; a plurality of substrates placed on one surface of the base plate, with each substrate of the plurality of substrates including a switching element, a diode element, and a connection terminal area; and a parallel flow forming device that forms parallel coolant flow paths that are provided so as to be in contact with the other surface of the base plate. The coolant flow paths are formed such that coolant flows in a coolant flow direction. The switching element and the diode element are disposed in series in the coolant flow direction in each of the substrates. The switching element and the connection terminal area are disposed at positions that differ in a perpendicular direction with respect to the coolant flow direction in each of the substrates. A pair of substrates of the plurality of substrates is disposed in series in the coolant flow direction, the switching element is arranged on a first side in the perpendicular direction for one substrate of the pair of substrates and on a second side in the perpendicular direction for the other substrate of the pair of substrates. The connection terminal area is arranged on the second side in the perpendicular direction for the one substrate of the pair of substrates and on the first side in the perpendicular direction for the other substrate of the pair of substrates.

According to an exemplary aspect of the invention, a semiconductor module includes a base plate; a plurality of substrates placed on one surface of the base plate, with each substrate of the plurality of substrates including a switching element, a diode element, and a connection terminal area; and a parallel flow forming device that forms parallel coolant flow paths that are provided so as to be in contact with the other surface of the base plate. The coolant flow paths are formed such that coolant flows in a coolant flow direction. The switching element and the diode element are disposed in series in the coolant flow direction in each of the substrates. The switching element and the connection terminal area are disposed at positions that differ in a perpendicular direction with respect to the coolant flow direction in each of the substrates. A pair of substrates of the plurality of substrates is disposed in series in the coolant flow direction. The switching element for one substrate of the pair of substrates and the connection terminal area for the other substrate of the pair of substrates overlap in the perpendicular direction.

BRIEF DESCRIPTION OF THE DRAWINGS

Various exemplary embodiments of the invention will be described with reference to the drawings, wherein:

FIG. 5 is a cross-sectional perspective view of the semiconductor module according to the first embodiment of the present invention;

FIG. 9 is a plane view of the structure of the elements of the semiconductor module according to the second embodiment of the present invention;

FIG. 10 is a plane view that shows the structure of the elements of the semiconductor module according to the third embodiment of the present invention;

FIG. 11 is a plane view that shows the structure of the elements of the semiconductor module according to the fourth embodiment of the present invention;

FIG. 12 is a plane view that shows the structure of the elements of the semiconductor module according to the fifth embodiment of the present invention;

FIG. 15 is a drawing that shows the structure of a conventional semiconductor module.

DETAILED DESCRIPTION OF EMBODIMENTS

1. First Embodiment

The first embodiment of the present invention will be explained with reference to the figures. In the present embodiment, an example will be explained in which the present invention is applied to a semiconductor module 1 that serves as an inverter apparatus that structures an inverter circuit for three-phase alternating current. FIG. 1 to FIG. 8 are drawings for explaining the structure of the semiconductor module 1 according to the present embodiment. Note that FIG. 1 to FIG. 5 omit the structures other than the substrates 3 above the base plate 2.

Figure 1:
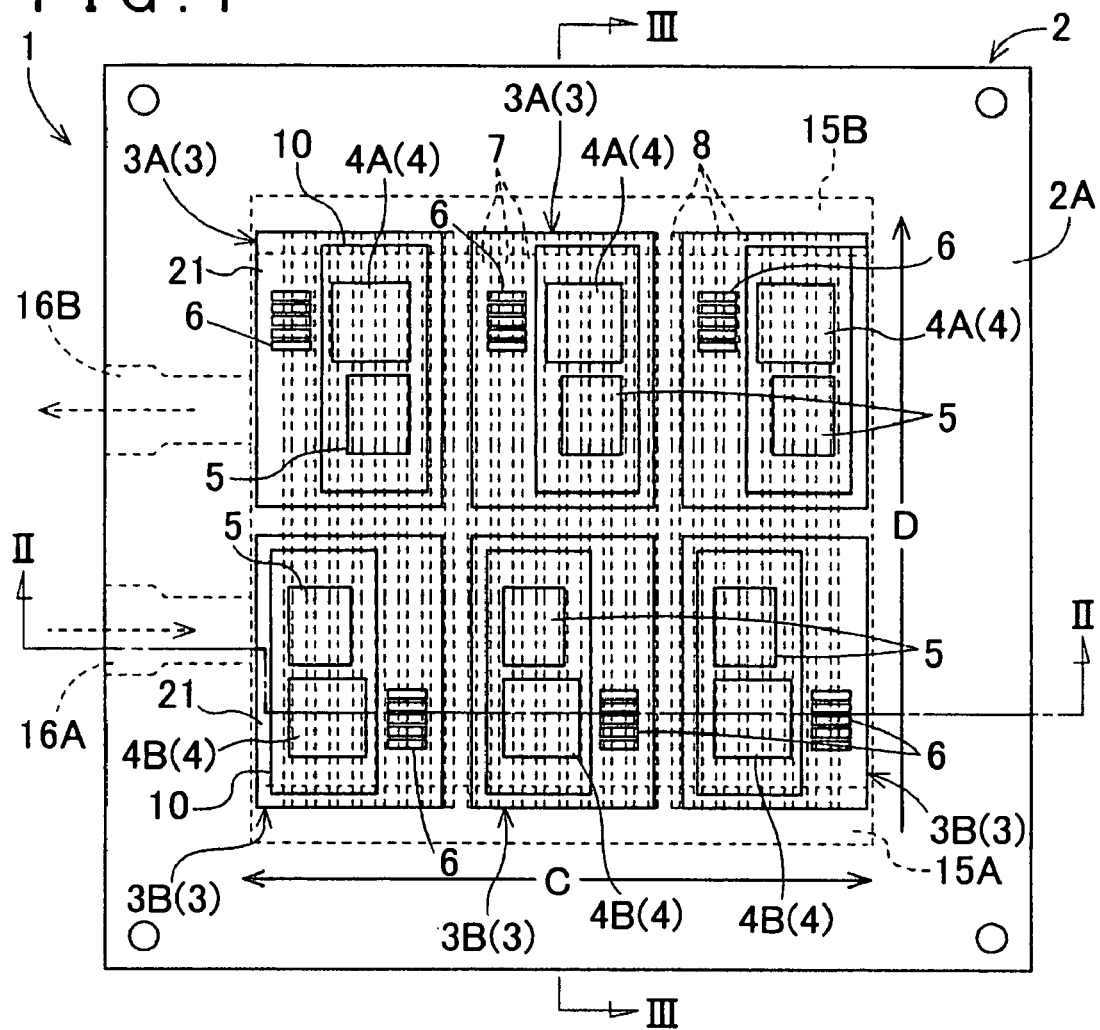
FIG. 1 is a plane view that shows the structure of the elements of the semiconductor module according to the first embodiment of the present invention.
Figure 6:
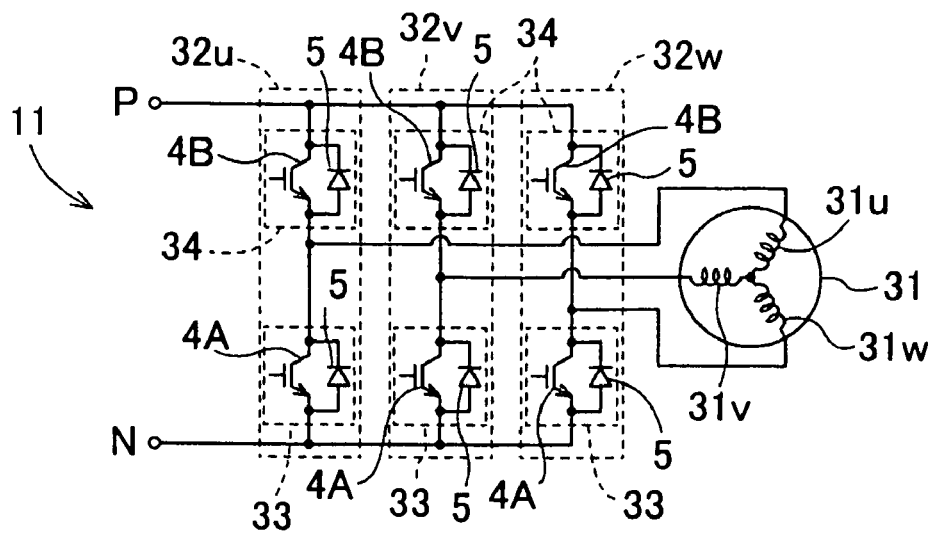
FIG. 6 is a wiring diagram of the inverter circuit according to the first embodiment of the present invention.
Figure 7:
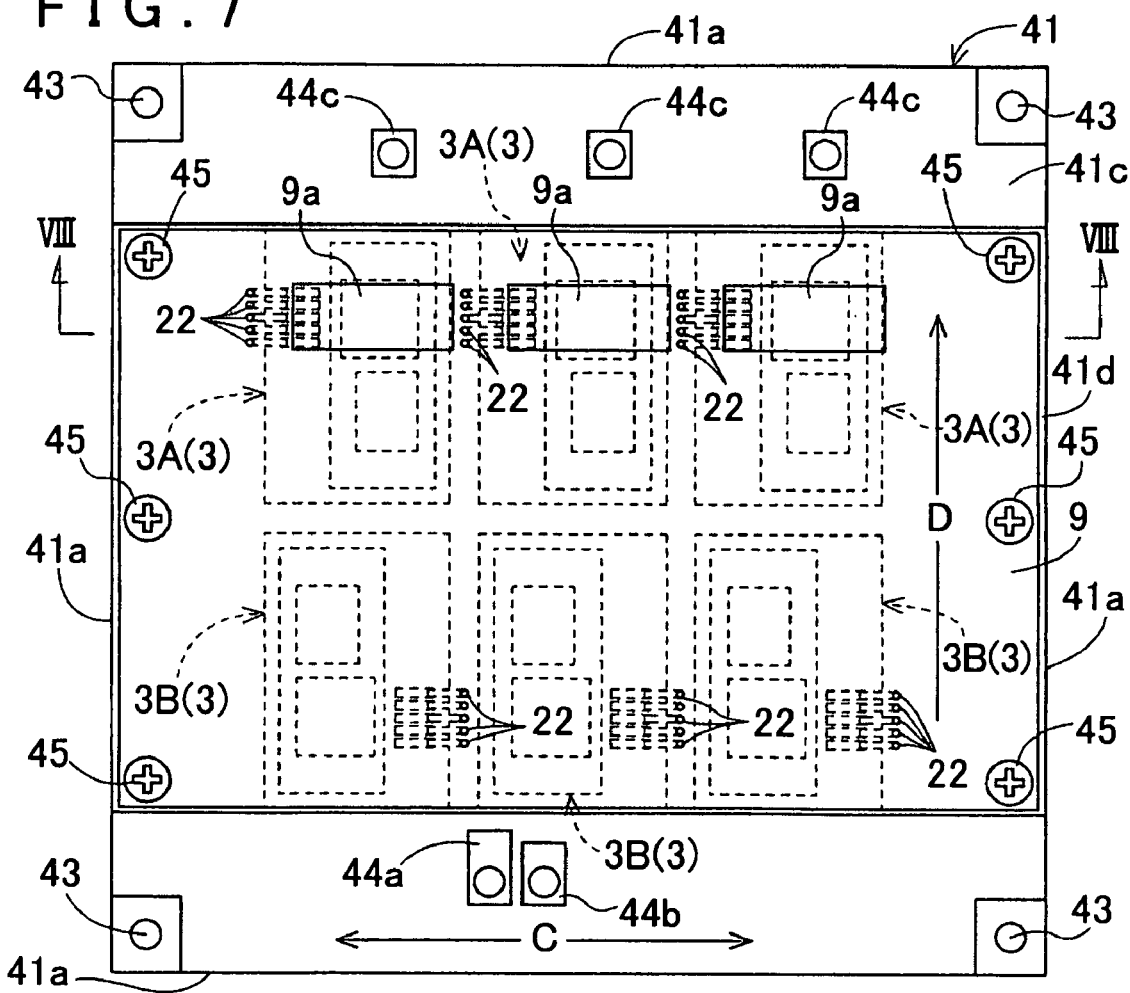
FIG. 7 is a plane view that shows the overall structure of the semiconductor module according to the first embodiment of the present invention.
Figure 8:
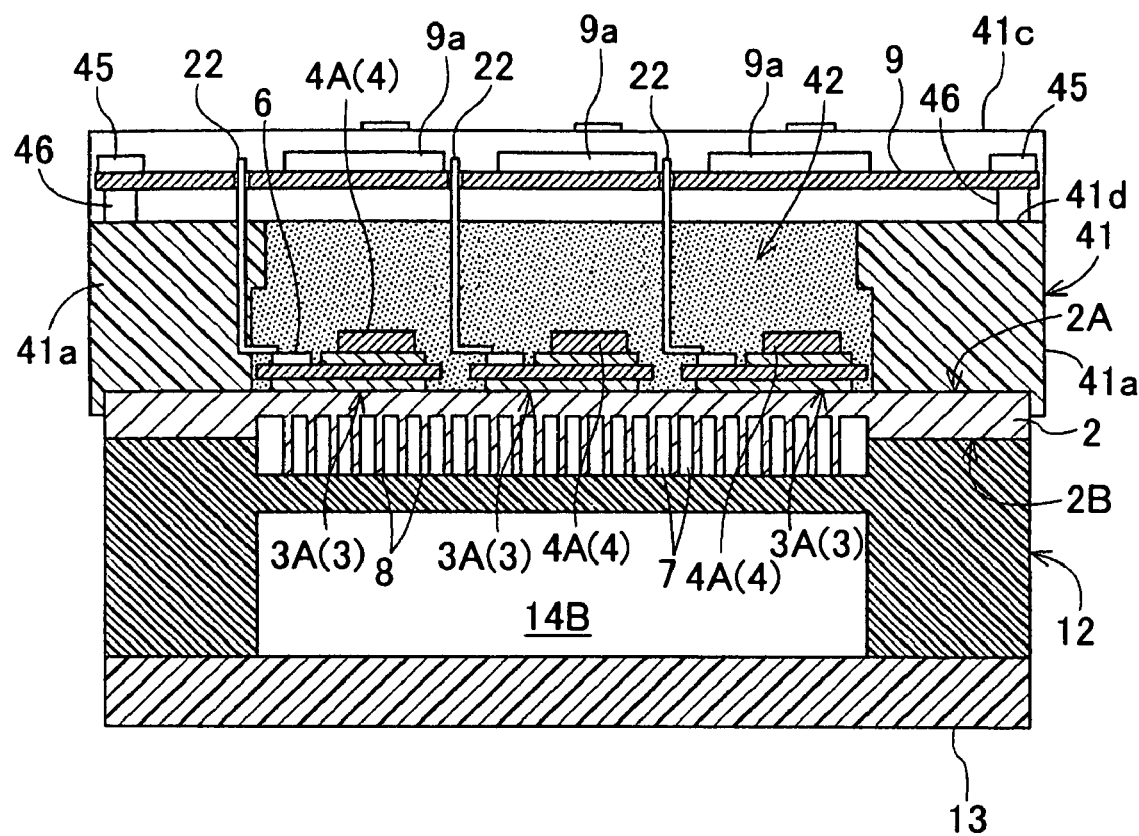
FIG. 8 is a cross-sectional view along VIII-VIII in FIG. 7.

As shown in these figures, this semiconductor module 1 is provided with a cooling structure that includes coolant flow paths 7 for carrying out the cooling, for example, of the switching elements 4, which have the highest amount of heat generation, of the substrates 3 that are mounted on the upper surface 2A of the base plate 2. In addition, as shown in FIG. 6, this semiconductor module 1 structures an inverter circuit 11 for driving the three-phase alternating current electric machine 31. Thus, as shown in FIG. 1, a structure is used in which the six substrates 3, which are each provided with the switching elements 4 and the diode elements 5, are mounted on the upper surface 2A of the base plate 2. Furthermore, as shown in FIG. 7 and FIG. 8, in this semiconductor module 1, a case 41 is mounted on the base plate 2 so as to enclose the six substrates 3, and a control substrate 9 for carrying out the operational control of the switching elements 4 of each of the substrates 3 is supported by this case 41. Below, the structure of each of the portions of the semiconductor module 1 will be explained in detail.

1-1. Cooling Structure for Substrates

First, the cooling structure for the substrates 3 in the semiconductor module 1 will be explained with reference to FIG. 1 to FIG. 5. As shown in FIG. 1, this semiconductor module 1 is provided with a base plate 2, six substrates 3 that are mounted on the upper surface 2A of this base plate 2, and coolant flow paths 7 that are provided so as to be in contact with the lower surface 2B of the base plate 2. Here, a plurality of fins 8 are provided that serves as a parallel flow forming device that allows the coolant to flow in a prescribed direction inside the coolant flow paths 7. As shown in FIG. 2 to FIG. 5, the plurality of fins 8 are mounted parallel to each other along the lower surface 2B of the base plate 2. Here, each of the fins 8 is formed into a plate shape having a prescribed thickness and is erected orthogonally to the lower surface 2B of the base plate 2, and each of the fins 8 is formed integrally with the base plate 2 by using a cutting process or the like on the lower surface 2B of the base plate 2. In addition, the interval between the plurality of fins 8 is substantially constant, and the height of the plurality of fins 8 is also constant. By providing such fins 8, the coolant that has been introduced into the coolant flow path 7 flows in the parallel paths of the coolant flow path. In other words, the coolant flows in a parallel flow that flows parallel to a direction that is regulated by the parallel flow forming device, that is, the direction along the fins 8. In the example that is illustrated, coolant that flows parallel to each other are formed between the plurality of fins 8. In addition, as shown in FIG. 1, the direction to the plurality of fins 8 (the direction from the bottom to the top in FIG. 1) is set to be the coolant flow direction D. In addition, the direction that is perpendicular to the flow direction D of this coolant is set to be the perpendicular direction C (the left to right direction in FIG. 1; hereinafter, referred to simply as the "perpendicular flow C") with respect to the flow direction of the coolant. Note that in the present embodiment, the upper surface 2A of the base plate 2 corresponds to one of the surfaces in the present invention, and the lower surface 2B corresponds to the other surface in the present invention.

Figure 2:
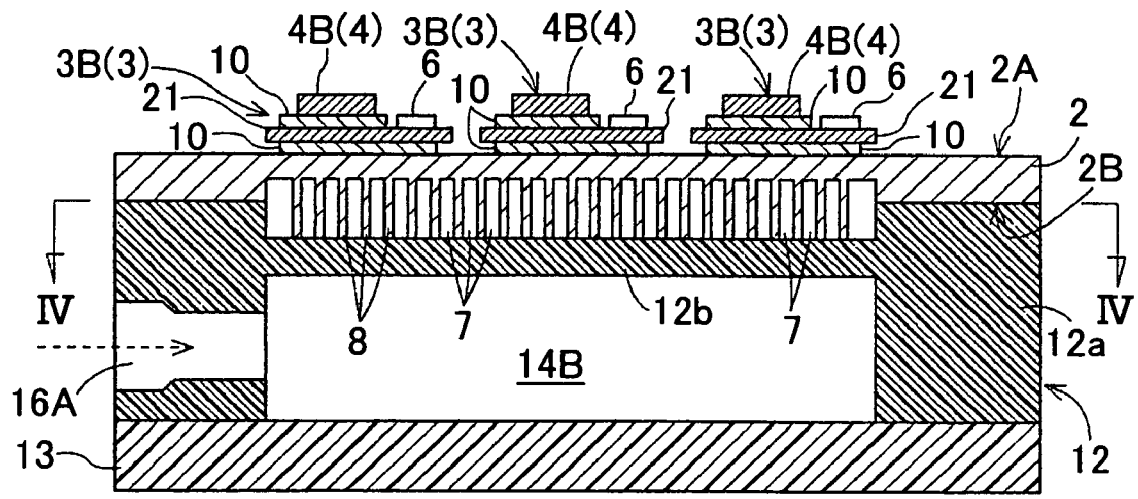
FIG. 2 is a cross-sectional view along II-II in FIG. 1.
Figure 3:
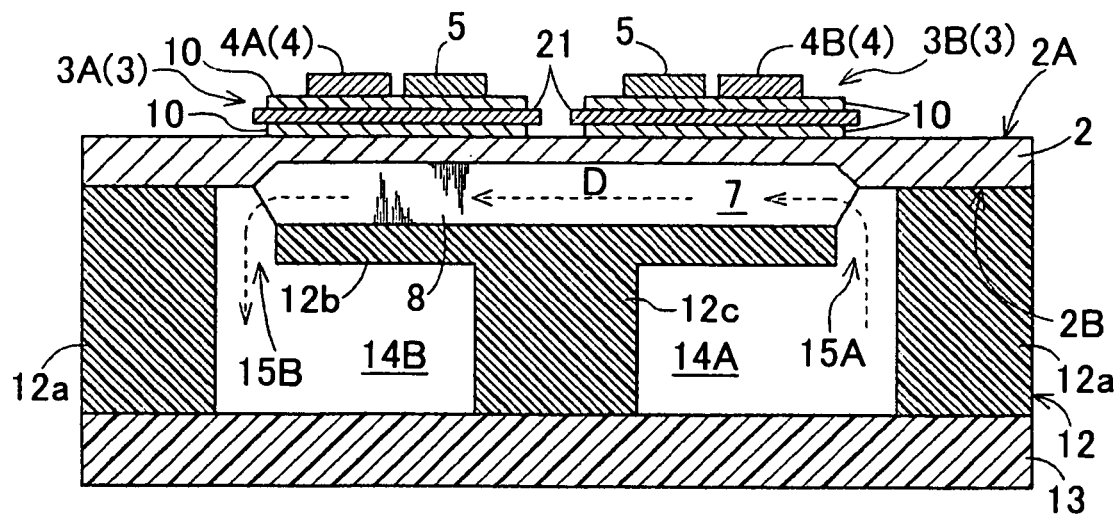
FIG. 3 is a cross-sectional view along III-III in FIG. 1.

As shown in FIG. 2, FIG. 3, and FIG. 5, the base plate 2 is supported by the water path forming member 12. In addition, a plate-shaped bottom plate member 13 is provided so as to cover the bottom surface of the water path forming member 12. Here, the water path forming member 12 has an outer profile that has a rectangular parallelepiped profile, in which the plane shape thereof is a shape that is substantially identical to that of the base plate 2. In addition, the water path forming member 12 includes a peripheral wall 12a that surrounds the outer periphery thereof, an abutting plate portion 12b that is formed inside this peripheral wall 12a, and a partitioning wall portion 12c. In addition, the upper surface of this peripheral wall 12a abuts the lower surface 2B of the base plate 2, and the lower surface of the peripheral wall 12a abuts the bottom plate member 13. The abutting plate portion 12b is a plate shaped portion that is provided so as to be in contact with the bottom surfaces (the bottom surface in FIG. 2 and FIG. 3) of the fins 8. Thus, coolant flow paths 7 are each formed by a plurality of elongated spaces that are enclosed by the plurality of fins 8 and the abutting plate portion 12b.

Therefore, the coolant flows in a parallel path through each of the plurality of coolant flow paths 7 that are partitioned by the plurality of fins 8. In addition, the partitioning wall portion 12*c* is a wall shaped member that is provided along the perpendicular direction C and partitions the space under the abutting plate portion 12*b* into two sections. Here, the space on the right side of the partitioning wall portion 12*c* in FIG. 3 and FIG. 5 serves as the inflow-side coolant reservoir 14A and the space on the left side serves as the outflow-side coolant reservoir 14B.

Figure 4:
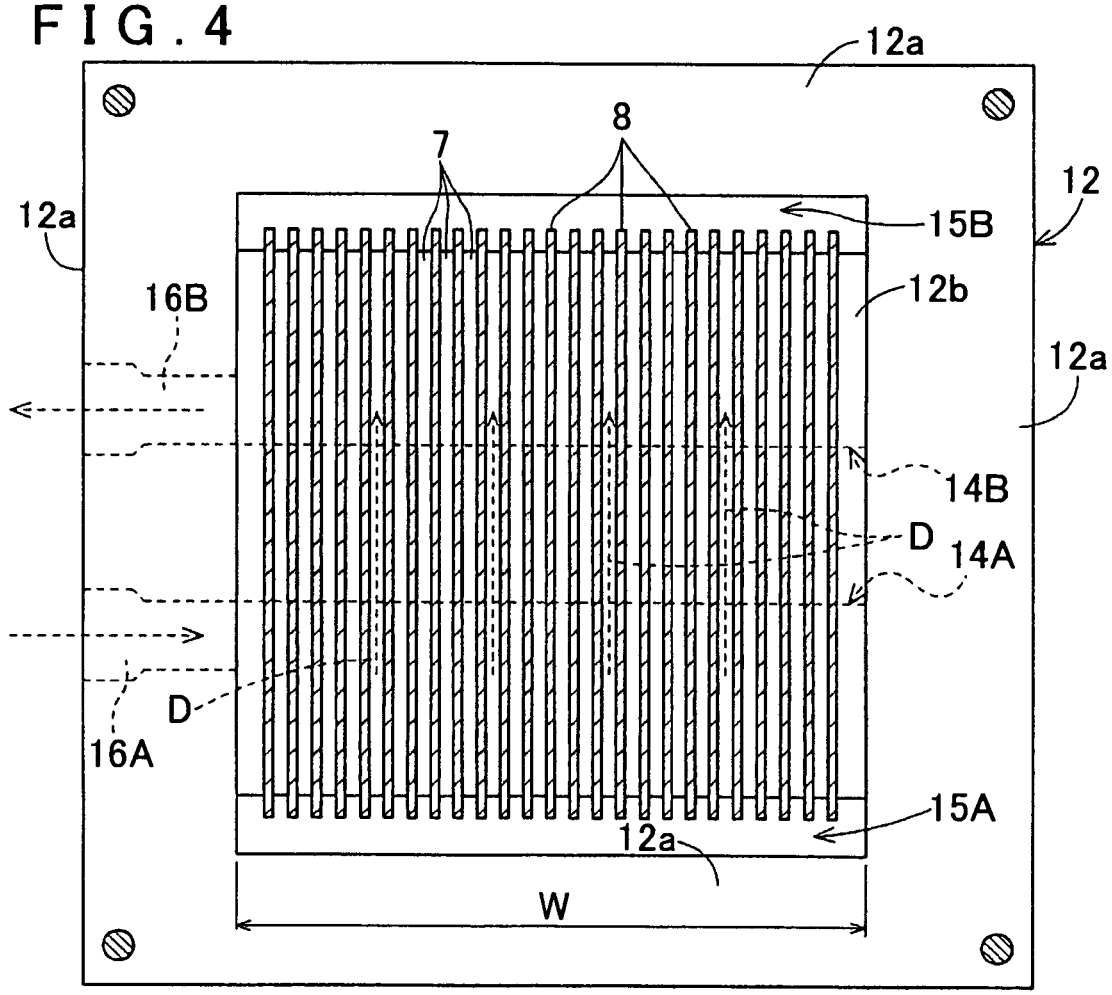
FIG. 4 is a cross-sectional view along IV-IV in FIG. 2.

In addition, the inflow-side coolant reservoir 14A communicates with the coolant flow paths 7 via the inflow-side constricted portion 15A, and the outflow-side coolant reservoir 14B communicates with the coolant flow paths 7 via the outflow-side constricted portion 15B. The inflow-side constricted portion 1SA and the outflow-side constricted portion 15B are formed by gaps between the peripheral wall 12*a* and the abutting plate portion 12*b* of the water path forming member 12. As shown in FIG. 4, the inflow-side constricted portion 15A and the outflow-side constricted portion 15B are both formed as long slit shaped opening portions in the perpendicular direction C. In addition, the inflow-side cooling reservoir 14A, the outflow-side coolant reservoir 14B, the inflow-side constricted portion 15A, and the outflow-side constricted portion 15B all have a length in the perpendicular direction C that is identical to the total width W of the coolant flow paths 7.

In addition, the coolant flows as follows. Specifically, as shown in FIG. 4, the coolant is fed to the inflow-side coolant reservoir 14A after flowing in from the inflow path 16A due to the discharge pressure and the like of a pump (not illustrated). Then, as shown in FIG. 3 to FIG. 5, the coolant that has filled this inflow-side coolant reservoir 14A flows into the coolant flow paths 7 between the plurality of fins 8 after passing through the inflow-side constricted portion 15A. Then, when flowing through the coolant flow paths 7, the coolant carries out heat exchange between the base plate 2 and the fins 8, and thereby the cooling of the substrates 3 on the base plate 2 is carried out. Next, the coolant that has passed through the coolant flow paths 7 is fed to the outflow-side coolant reservoir 14B after passing through the outflow-side constricted portion 15B. Subsequently, the coolant that has filled in the outflow-side coolant reservoir 14B is discharged by passing through the outflow path 16B. As explained above, the coolant flow direction D in the coolant flow paths 7 is the direction that is parallel to the plurality of fins 8. In order to carry out the heat exchange between the base plate 2 and the fins 8 efficiently, preferably the base plate 2 and the fins 8 are structured by a metal (for example, copper) that has a high thermal conductivity. Note that in the present embodiment, a coolant fluid added with ethylene glycol or the like to water, which is used in vehicles and the like, is used as the coolant.

1-2. Configuration of the Substrates

Next, the configuration of the substrates 3, which are elements of the present invention, in the semiconductor module 1 will be explained with reference to FIG. 1. In the present embodiment, six substrates 3 are arranged in the upper surface 2A of the base plate 2, and arranged with two in the coolant flow direction D, and three in the perpendicular direction C. In addition, these six substrates 3 structure an inverter circuit 11, which will be explained below.

The substrates 3 include lower arm substrates 3A and upper arm substrates 3B, where the lower arm substrates 3A are provided with lower arm switching elements 4A that structure the lower arm 33 of the inverter circuit 11 (refer to FIG. 6), and the upper arm substrates 3B are provided with upper arm switching elements 4B that structure the upper arm 34 of the inverter circuit 11 (refer to FIG. 6). Here, among the six substrates 3, the three substrates 3 that are arranged in the downstream side (the upper side in FIG. 1) in the coolant flow direction D serve as the lower arm substrates 3A, and the other three substrates 3 that are arranged in the upstream side (the lower side in FIG. 1) in the coolant flow direction D serve as the upper arm substrates 3B. In addition, in the six substrates 3, the (pairs of) lower arm substrates 3A and upper arm substrates 3B that form pairs that are disposed in series in the coolant flow direction D (arranged in a vertical direction in FIG. 1) form one group, and are disposed by three groups of substrates 3 arranged in the perpendicular direction C. In this manner, one pair of substrates 3A and 3B also form a pair in terms of the cooling structure due to being respectively arranged in the upstream side and the downstream side thereof. Note that the concept of the lower arm and the upper arm will be explained below with reference to FIG. 6. In addition, in the following explanation, simply referring to the expression "substrates 3" includes the lower arm substrates 3A and the upper arm substrates 3B, and simply referring to the expression "switching elements 4" includes the lower arm switching elements 4A and the upper arm switching elements 4B.

Each of the substrates 3 is provided with one switching element 4, diode element 5, and connection terminal area 6. Specifically, the substrates 3 provide a copper foil 10 on both the upper and lower side surfaces of the substrate body 21, which is structured by an insulating substrate. The copper foil 10 on the lower side is attached to the base plate 2 by soldering (not illustrated), and the switching element 4 and the diode element 5 are attached via soldering (not illustrated) on the copper foil 10 of the upper side. Here, the switching element 4 is specifically an IGBT element (Insulated Gate Bipolar Transistor), and the diode element 5 is specifically a FWD element (Free Wheel Diode). Thus, in the substrates 3, the heat generation amount of the switching elements 4 is the greatest. In addition, the connection terminal areas 6 are provided so as to be directly mounted on the substrate body 21 in an area on the upper side where the copper foil 10 is not provided. Note that although omitted in FIG. 1, lead pins 22 (refer to FIG. 7 and FIG. 8) for electrically connecting the switching elements 4 and the control substrate 9 are attached to the connection terminal area 6 via soldering in this connection terminal area 6. In addition, wire bonding is also carried out in order to electrically connect the switching elements 4 and the lead pins 22.

In addition, the disposition of the switching elements 4, the diode elements 5, and the connection terminal areas 6 on each of the substrates 3 is as follows. Specifically, as shown in FIG. 1, the switching element 4 and the diode element 5 are disposed in series (arranged in the vertical direction in FIG. 1) in the coolant flow direction D. In the illustrated example, the switching element 4 has an external profile that is slightly larger than the diode element 5. In addition, the center position of the diode element 5 in the perpendicular direction C is disposed at a position that is offset to one side (the side away from the connection terminal area 6) in the perpendicular direction C with respect to the center position of the switching element 4 in the perpendicular direction C, and the edges of the switching element 4 and the diode element 5 on one side in the perpendicular direction C lie on the same line. Here, in the example that is shown in FIG. 1, the expression "one side of the perpendicular direction C" denotes the right side of the lower arm substrates 3A in the perpendicular direction C and denotes the left side of the upper arm substrates 3B in the perpendicular direction C. In addition, the switching element 4 and the connection terminal area 6 are disposed such that their positions are different in the perpendicular direction C. Specifically, the connection terminal area 6 is disposed at a position that is substantially identical to that of the switching element 4 in the coolant flow direction D, and disposed adjacent to the other side of the switching element 4 in the perpendicular direction C. Here, in the example that is shown in FIG. 1, the expression "the other side in the perpendicular direction C" denotes the left side of the lower arm substrates 3A in the perpendicular direction C and denotes the right side of the upper substrates 3B in the perpendicular direction C. In the example in the figure, in conformity with such a disposition of each of the elements, the substrate body 21 of each of the substrates 3 is formed in a plate shape having a long rectangular shape in plane view in the coolant flow direction D.

In addition, as described above, in the relationship between a pair of lower arm substrates 3A and the upper arm substrates 3B, which are disposed in series (arranged in the vertical direction in FIG. 1) in the coolant flow direction D, that is, in the relationship of a pair of substrates 3 that structure each group, the switching element 4 is arranged on the one substrate 3 on the one side in the perpendicular direction C, and the connection terminal area 6 is arranged on the other substrate 3 on the other side in the perpendicular direction C. Specifically, at the lower arm substrates 3A, the switching element 4 is arranged on the right side (the right side in FIG. 1) in the perpendicular direction C, and the connection terminal area 6 is arranged in the left side (the left side in FIG. 1) in the perpendicular direction C. In contrast, in the upper arm substrates 3B, in contrast to the lower arm substrates 3A, the connection terminal area 6 is arranged on the right side in the perpendicular direction C, and the switching element 4 is arranged on the left side in the perpendicular direction C.

Described another way, when viewing the lower arm substrates 3A and the upper arm substrates 3B in series as shown in FIG. 1, a right side (for example, first side) and a left side (for example, second side) of the lower arm substrates 3A and the upper arm substrates 3B is cooled by coolant that flows in the coolant flow direction D. The lower arm switching elements 4A are arranged on the right side in the perpendicular direction C for the lower arm substrates 3A and the upper arm switching elements 4B are arranged on the left side in the perpendicular direction C for the upper arm substrates 3B. The connection terminal area 6 is arranged on the left side in the perpendicular direction C for the lower arm substrates 3A and the connection terminal area 6 is arranged on the right side in the perpendicular direction C for the upper arm substrates 3B. In other words, both the lower arm switching elements 4A of the lower arm substrates 3A and the connection terminal area 6 of the upper arm substrates 3B are arranged on the right side in the perpendicular direction C, and both the connection terminal area 6 of the lower arm substrates 3A and the upper arm switching elements 4B of the upper arm substrates 3B are arranged on the left side in the perpendicular direction C.

In the present embodiment, in order to realize the disposition of the pairs of lower arm substrates 3A and upper arm substrates 3B that satisfy such a disposition, a pair of substrates 3A and 3B have an identical structure, and these pairs of the substrates 3A and 3B are disposed in point symmetry. In this context, based on the center position both in the coolant flow direction D between the pairs of the substrates 3A and 3B and in the perpendicular direction C, the pair of substrates 3A and 3B are disposed in point symmetry.

For the pairs of the substrates 3A and 3B that are disposed in a row in the coolant flow direction D, because of such a configuration, the lower arm switching elements 4A and the upper arm switching elements 4B of the pair of substrates 3A and 3B are offset so as to have substantially different positions in the perpendicular direction C. Therefore, when viewing each of the plurality of parallel coolant flows that flow through the plurality of coolant flow paths 7 that are formed between the fins 8, it is possible to use a structure in which the same coolant flow that flows through one of the coolant flow paths 7 basically carries out the cooling of only one among the upper arm switching elements 4B and the lower arm switching elements 4A. Therefore, it is possible to appropriately cool each of the switching elements 4A and 4B of both pairs of the substrates 3A and 3B. In other words, it is possible to suppress the reduction in the cooling capacity of the lower arm switching elements 4A on the downstream side of the coolant flow direction D that occurs by using a structure in which the same coolant flow, whose temperature has risen due to carrying out the cooling of the upper arm switching elements 4B on the upstream side, further carries out the cooling of the lower arm switching elements 4A on the downstream side.

In addition, in the present embodiment, the diode element 5 of both of the pairs of substrates 3A and 3B is disposed closer to the other substrate 3 side (closer to a side that is between the pairs of substrates 3A and 3B) than the switching element 4 in each of the substrates 3. Specifically, in the lower arm substrates 3A, the diode element 5 is disposed closer to the upper arm substrate 3B side than the lower arm switching element 4A. In addition, in the upper arm substrate 3B, the diode element 5 is disposed closer to the lower arm substrate 3A side than the upper arm switching element 4B. Thereby, the lower arm switching element 4A and the upper arm switching element 4B are disposed such that the diode elements 5 of both of the pairs of the substrates 3A and 3B are interposed there between in the coolant flow direction D, and thus the switching elements 4A and 4B that generate the largest amount of heat can be disposed at positions that are separated from each other in the pairs of the substrates 3A and 3B. Thereby, it is possible to suppress the occurrence of thermal interference at the base plate 2 due to the heat that is transmitted from each of the switching elements 4A and 4B of the pairs of the substrates 3A and 3B.

Note that in the present embodiment, the diode element 5 is disposed at a position in the perpendicular direction C that is substantially identical to that of the switching elements 4, and thus, similar to each of the switching elements 4 in the pairs of the substrates 3A and 3B, each of the diode elements 5 on the pairs of the substrates 3A and 3B are arranged on the one substrate 3 at one side in the perpendicular direction C and arranged on the other substrate 3 on the other side in the perpendicular direction C. Specifically, the diode elements 5 are arranged on the right side (the right side in FIG. 1) in the perpendicular direction C on the lower arm substrates 3A and arranged on the left side (the left side in FIG. 1) in the perpendicular direction C on the upper arm substrates 3B. Thereby, when viewed along the parallel coolant flows in the coolant flow paths 7, it is possible to use a structure in which the same coolant basically cools only the diode elements 5 on either one of the pair of substrates 3A and 3B. Therefore, it is possible to cool the diode elements 5 in both of the pairs of substrates 3A and 3B substantially evenly.

3. Structure of the Inverter Circuit

Next, the electrical structure of the inverter circuit 11 that is structured by the semiconductor module 1 according to the present embodiment will be explained. As shown in FIG. 6, this inverter circuit 11 is a drive circuit for a three-phase alternating current electric machine 31. Specifically, this inverter circuit 11 is provided with a U-phase arm 32u, a V-phase arm 32v, and a W-phase arm 32w (corresponding to each of the phases: the U-phase, the V-phase, and the W-phase) that are provided corresponding respectively to the U-phase coil 31u, the V-phase coil 31v, and the W-phase coil 31w of a three-phase alternating current electric machine 31. In addition, these arms 32u, 32v, and 32w for each phase are structured so as to include pairs of a lower arm 33 and an upper arm 34 that can each act in a complementary manner. Here, the lower arms 33 are structured so as to include a lower arm switching element 4A, which is an IGBT element, and a diode element 5, which is connected in parallel between emitters and collectors of these lower arm switching elements 4A. Similarly, the upper arm 34 is structured so as to include an upper arm switching element 4B, which is an IGBT element, and a diode element 5, which is connected in parallel between the emitters and the collectors of this upper arm switching elements 4B. Here, anodes of the diode elements 5 are connected to the emitters of the switching elements 4A and 4B, and cathodes of the diode elements 5 are connected to the collectors of the switching diodes 4A and 4B.

In addition, the pair of a lower arm 33 and an upper arm 34 for each of the phases are connected in series such that the lower arm 33 is on the negative electrode N side, which serves as the ground, and the upper arm 34 is on the positive electrode P side, which serves as the power supply voltage. Specifically, the emitters of the lower arm switching elements 4A are connected to the negative electrode N and the collectors of the upper arm switching elements 4B are connected to the positive electrode P. Specifically, the lower arm switching element 4A serves as the lower side switch, and the upper arm switching element 4B serves as the higher side switch. In addition, the collectors of the lower arm switching elements 4A and the emitters of the upper arm switching elements 4B are each connected to the U-phase coil 31u, the V-phase coil 31v, and the W-phase coil 31w of the electric machine 31, which correspond to the arms 32u, 32v, and 32w, respectively.

In this inverter circuit 11, in relation to each of the substrates 3 of the semiconductor module 1, the lower arm switching elements 4A and the diode elements 5 of the lower arm substrates 3A form the lower arms 32, and the upper arm switching elements 4B and the diode elements 5 of the upper arm substrates 3B form the upper arms 33. Specifically, among the six substrates 3 that are arranged in the base plate 2, the three lower arm substrates 3A that are arranged in the downstream side (the upper side in FIG. 1) of the coolant flow direction D respectively structure the lower arms 32 of the U-phase arm 32u, the V-phase arm 32v, and the W-phase arm 32w, and the three upper arm substrates 3B that are arranged in the upstream side (the lower side in FIG. 1) of the coolant flow direction D respectively structure the upper arms 33 of the U-phase arm 32u, the V-phase arm 32v, and the W-phase arm 32w. In addition, on the base plate 2, the pair (one group) of a lower arm substrate 3A and an upper arm substrate 3B that are disposed in series (arranged in the vertical direction in FIG. 1) in the coolant flow direction D respectively structure any one of the U-phase arm 32u, the V-phase arm 32v, and the W-phase 32w. Therefore, for example, the pair of substrates 3A and 3B on the left side (the left side in FIG. 1) in the perpendicular direction C structure the U-phase arm 32u, the pair of substrates 3A and 3B at the center in the perpendicular direction C structure the V-phase arm 32v, and the pair of substrates 3A and 3B on the right side (the right side in FIG. 1) in the perpendicular direction C structure the W-phase arm 32w.

1-4. Structure of the Upper Portion of the Semiconductor Module

Next, the structure of the upper portion of the semiconductor module 1 that is provided on the upper side of the base plate 2 will be explained. As shown in FIG. 7 and FIG. 8, this semiconductor module 1 includes, as such an upper portion structure, a resin case 41 that is mounted on the base plate 2 and that is provided so as to surround the six substrates 3 described above, and the control substrate 9 that is supported above the six substrates 3 by this case 41.

Here, the case 41 has a rectangular parallelepiped profile in which the planar profile has a rectangular shape that is slightly larger than the base plate 2. This case 41 is structured so as to form a housing space 42 that houses the six substrates 3 that are mounted on the base plate 2, and so as to include a peripheral wall portion 41a that is provided so as to surround the periphery of this housing space. Note that, a filling material such as an epoxy resin is filled into this housing space 42 and hardened. Thus, in the end, the six substrates 3 that are mounted on the base plate 2 and the case 41 are integrated. In addition, as shown in FIG. 7, at the four corners of the case 41, fastening holes 43, into which a fastening device such as bolts are inserted, are provided in order to fasten the case 41 on the base plate 2.

In addition, the upper surface of the peripheral wall 41a is structured by the two surfaces, i.e., the surfaces of the first upper surface 41c and the second upper surface 41d, which have different heights. Here, the first upper surface 41c is a rectangular surface that is provided on the upstream side and the downstream side in the coolant flow direction D (the upper side and the lower side in FIG. 7), respectively, and is elongated in the perpendicular direction C. In addition, the second upper surface 41d is a surface that is one step lower than the first surface 41c. The positive electrode terminal 44a, the negative electrode terminal 44b, and the output terminal 44c, which are external derivation terminals of the lead frame (not illustrated) that are disposed inside the case 41 and are electrically connected to each of the substrates 3, are provided on the first upper surface 41c of the case 41. Here, one each of a positive electrode terminal 44a and a negative electrode terminal 44b are provided on the first upper surface 41c on the lower side in FIG. 7, and at the same time, the three output terminals 44c are provided on the first upper surface 41c on the upper side in FIG. 7. The positive terminal 44a is electrically connected to the positive electrode P and the negative terminal 44b is electrically connected to the negative electrode N. In addition, the three output terminals 44c are respectively electrically connected to the U-phase coil 31u, the V-phase coil 31v, and the W-phase coil 31w (refer to FIG. 6) of the three-phase alternating current electric machine 31.

The control substrate 9 is disposed above the second upper surface 41d of the case 41. Thus, female screw portions (not illustrated), into which the bolts 45 for fastening the control plate 9 are screwed, are formed at a plurality of locations in proximity to the edges on both sides of the second upper surface 41d in the perpendicular direction C. The control substrate 9 is fastened and fixed to the case 41 by the plurality of bolts 45. In addition, the control substrate 9 is disposed parallel to these surfaces, with a constant gap there between, by spacers 46 that are disposed between the control substrate 9 and the upper surface of the second upper surface 41d.

In addition, the plurality of lead pins 22 that are attached to the connection terminal areas 6 of each of the substrates 3 penetrate the control substrate 9 and are attached by soldering onto the wiring pattern (not illustrated) that is provided in the upper surface of the control substrate 9. In the present embodiment, in relation to two groups that are adjacent to each other, where a pair of substrates 3A and 3B form one group, the lead pins 22 of the lower arm substrate 3A in one group and the lead pin 22 of the upper arm substrate 3B of the other group are disposed so as to be arranged in a row in the coolant flow direction D. The control substrate 9 is a substrate on which the control circuits for driving the inverter circuit 11 are formed, and is structured by packaging prescribed circuit components on a printed substrate. In addition, the lead pins 22 electrically connect this control substrate 9 and the plurality of substrates 3 that are arranged in the base plate 2.

In addition, the temperature detecting circuits 9a, which functions as a temperature detecting device for detecting the temperature of the switching elements 4 of each of the substrates 3, are mounted on this control substrate 9. Here, the temperature detecting circuits 9a are arithmetic circuits that detect the temperatures of each of the switching elements 4 by detecting the voltage between the anode and cathode of the temperature detecting diodes (not illustrated) that are provided in the switching elements 4, and carrying out predetermined calculations. In the present embodiment, among each of the switching elements 4A and 4B of a pair of substrates 3A and 3B, the temperature detecting circuits 9a are provided only for the lower arm switching elements 4A of the lower arm substrates 3A, which are disposed downstream in the coolant flow direction D. In other words, the temperature detecting circuits 9a are omitted in the upper arm switching elements 4B of the upper arm substrates 3B, which are disposed upstream in the coolant flow direction D. Thus, this semiconductor module 1 is structured so as to carry out the temperature detection for the temperature control of both switching elements 4A and 4B of the pair of substrates 3A and 3B by using the temperature detecting circuits 9a that are mounted on the lower arm switching elements 4A, which are disposed downstream in the coolant flow direction D. Note that as temperature management of the switching elements 4A and 4B, the control substrate 9 carries out control in which, for example, the temperatures of the switching elements 4A and 4B are monitored so as to remain within a prescribed safe operating temperature range, and when this temperature range is exceeded, the operation of the switching elements 4A and 4B is stopped.

In this manner, by using a structure in which temperature detecting circuits 9a are provided only for the lower arm switching elements 4A, which are disposed downstream in the coolant flow direction D, it is possible to reduce the number of temperature detecting circuits 9a by half in comparison to the case in which the temperature detecting circuits 9a are also provided for the upper arm switching elements 4B. In addition, normally the temperature of the downstream coolant is higher than the upstream coolant in the coolant flow direction D, and thus there is a high probability that the temperature of the lower arm switching elements 4A, which are disposed downstream, will be higher than the temperature of the upper arm switching elements 4B, which are disposed upstream. Thus, even if temperature control is carried out using only the temperature detection results of the lower arm switching element 4A, the temperature of the upper arm switching element 4B will not exceed the prescribed safe operating temperature range, consequently posing no problem. Furthermore, in the present embodiment, it is possible to simplify the structure of the temperature detecting circuits 9a because the lower arm switching elements 4A are disposed downstream in the coolant flow direction D. Specifically, it is possible to use temperature detecting circuits 9a that are arithmetic circuits based on the electrical potential of the negative electrode N (the ground) by using all of the temperature detecting circuits 9a to detect the temperature of the lower arm switching elements 4A. Therefore, in comparison to a temperature detecting circuit 9a that is based on the electrical potential of the positive electrode P, it is possible to simplify the structure of the temperature detecting circuits 9a. Thus, it is possible to realize cost reductions of the semiconductor module 1.

2. Second Embodiment

A second embodiment of the present invention will be explained with reference to the figures. FIG. 9 is a plane view that shows the structure of the elements of the semiconductor module 1 according to the present embodiment. As shown in the figure, the semiconductor module 1 according to the present embodiment is structured such that only one group, which is structured by a pair of a lower arm substrate 3A and an upper arm substrate 3B, is mounted on one base plate 2. Specifically, in the semiconductor module 1 according to the present embodiment, the number of substrates 3 that are mounted on one base plate 2 differs from the number in the first embodiment. Note that points that are not explained in particular in the present embodiment can use structures that are identical to those in the first embodiment.

Therefore, in the semiconductor module 1 according to the present embodiment, in comparison to the semiconductor module 1 according to the first embodiment described above, a structure is used in which the width of the base plate 2 in the perpendicular direction C is narrow and the total width W of the coolant flow paths 7 is also narrow. In addition, although omitted from the figures, the profile of the upper structure of the semiconductor module 1 is also structured such that the case 41 is formed in conformity to the shape of the base plate 2, and the control substrate 9 is suitable for controlling the pair of substrates 3A and 3B. This semiconductor module 1 can structure the inverter circuit 11 similar to that of the first embodiment described above by combining three groups. In addition, when this semiconductor module 1 is used singly, it is possible to structure, for example, a chopper circuit by combinations of coils and capacitors and the like. Note that although omitted from the figures, one preferable embodiment of the present invention is structuring the semiconductor module 1 by mounting two groups or four or more groups that are formed by a pair of a lower arm substrate 3A and an upper arm substrate 3B on one base plate 2. For example, in the case in which an inverter circuit for a single phase alternating current is formed, preferably a structure is used in which two groups that are structured by a pair of a lower arm substrate 3A and an upper arm substrate 3B are mounted on one base plate 2.

3. Third Embodiment

The third embodiment of the present invention will be explained with reference to the figures. FIG. 10 is a plane view that shows the structure of the elements of the semiconductor module 1 according to the present embodiment. In the semiconductor module 1 according to the present embodiment, the configuration of the substrates 3 differs from that in the first and second embodiments. Here, in order to simplify the drawings and the like, similar to the second embodiment described above, an explanation will be provided using an example of a structure in which only one group structured by a pair of substrates 3A and 3B is mounted on one base plate 2. However, naturally, similar to the first embodiment described above, it is similarly also possible to use the structure in which a pair of substrates 3A and 3B form one group and a plurality of groups of substrates 3 are mounted on the base plate 2. Note that points that are not explained in particular in the present embodiment can use structures that are identical to those as the first or second embodiment.

In the semiconductor module 1 according to the present embodiment, the disposition of the switching elements 4, the diode elements 5, and the connection terminal areas 6 in the lower arm substrate 3A is identical to that in the first and second embodiments described above, while the disposition of the switching elements 4, the diode elements 5, and the connection terminal areas 6 in the upper arm substrates 3B is different from those in the embodiments above. Specifically, in the present embodiment, in the upper arm substrate 3B, the switching element 4 is disposed closer to the lower arm substrate 3A side than the diode element 5. Thus, in this semiconductor module 1, only the diode element 5 of the lower arm substrate 3A, which is one of substrates 3A and 3B that form a pair, is disposed closer to the upper arm substrate 3B side than the switching element 4A of this substrate 3A. Note that because the connection terminal area 6 of the upper arm substrate 3B is disposed in proximity to the switching element 4, similar to the switching element 4, the connection terminal area 6 is disposed closer to the lower arm substrate 3A side than the diode element 5. In addition, the positional relationships between the switching element 4 and the connection terminal element 6 in each of the substrates 3A and 3B in the perpendicular direction C are identical to those in the first and second embodiments described above.

Therefore, in this semiconductor module 1, the lower arm substrate 3A and the upper arm substrate 3B do not have identical structures, and the upper arm substrate 3B is structured such that the positional relationships in the perpendicular direction C are interchanged by mirror-inverting the lower arm substrates 3A. In addition, the configuration of the substrates 3 of the semiconductor module 1 according to the present embodiment is realized by disposing both the lower arm substrate 3A and the upper arm substrate 3B in series such that the switching element 4 is positioned downstream in the coolant flow direction D.

4. Fourth Embodiment

A fourth embodiment of the present invention will be explained with reference to the figures. FIG. 11 is a plane view that shows the structure of the elements of the semiconductor module 1 according to the present embodiment. In the semiconductor module 1 according to the present embodiment, the configuration of the substrates 3 is different from that of the first to third embodiments described above. Here, in order to simplify the drawings and the like, similar to the second embodiment described above, an explanation will be provided by using an example of a structure in which only one group structured by a pair of substrates 3A and 3B is mounted on one base plate 2. However, naturally, similar to the first embodiment described above, it is similarly also possible to use the structure in which a pair of substrates 3A and 3B form one group and a plurality of groups of substrates 3 are mounted on the base plate 2. Note that points that are not explained in particular in the present embodiment can use structures that are identical to those in the first or second embodiment.

In the semiconductor module 1 according to the present embodiment, while the disposition of the switching element 4, the diode element 5, and the connection terminal area 6 in the upper arm substrate 3B is identical to that of the first and second embodiments described above, the disposition of the switching element 4, the diode element 5 and the connection terminal area 6 in the lower arm substrate 3A is different from those in the embodiments above. Specifically, in the present embodiment, in the lower arm substrates 3A, the switching element 4 is disposed closer to the upper arm substrate 3B side than the diode element 5. Thus, in this semiconductor module 1, only the diode element 5 of the upper arm substrate 3B, which is one of substrates 3A and 3B that form a pair, is disposed closer to the lower arm substrate 3A than the switching element 4B of the substrate 3B. Moreover, because the connection terminal area 6 of the lower arm substrate 3A is disposed adjacent to the switching element 4, similar to the switching element 4, the connection terminal area 6 of the lower arm substrate 3A is disposed closer to the upper arm substrate 3B than the diode element 5. In addition, the positional relationships in the perpendicular direction C between the switching elements 4 and the connection terminal areas 6 in the perpendicular direction C in each of the substrates 3A and 3B are identical to those in the first and second embodiments described above.

Therefore, in this semiconductor module 1, the lower arm substrate 3A and the upper arm substrate 3B do not have an identical structure, and the lower arm substrate 3A is structured such that the positional relationships in the perpendicular direction C are interchanged by mirror-inverting the upper arm substrate 3B. In addition, the configuration of the substrates 3 of the semiconductor module 1 according to the present invention is realized by disposing both of such lower arm substrate 3A and upper arm substrate 3B in series such that the switching element 4 is positioned on the upstream side in the coolant flow direction D.

5. Fifth Embodiment

The fifth embodiment of the present invention will be explained with reference to the figures. FIG. 12 is a plane view that shows the structure of the elements of the semiconductor module 1 according to the present embodiment. In the semiconductor module 1 according to the present embodiment, the configuration of the substrates 3 differs from that of the first through fourth embodiments. Here, in order to simplify the drawings and the like, similar to the second embodiment described above, an explanation will be provided by using an example of a structure in which only one group that is structured by a pair of substrates 3A and 3B is mounted on one base plate 2. However, naturally, similar to the first embodiment described above, it is similarly also possible to use the structure in which a pair of substrates 3A and 3B structure one group and a plurality of groups of substrates 3 are mounted on the base plate 2. Note that points that are not explained in particular in the present embodiment can use structures that are identical to those in the first or second embodiment.

In the semiconductor module 1 according to the present embodiment, while the structures itself of the lower arm substrate 3A and the upper arm substrate 3B are identical to the first and second embodiments described above, the structure differs in the point that both switching elements 4 of substrates 3A and 3B that form a pair are disposed closer to the other substrate 3 side than the diode elements 5 of each of the substrates 3. Specifically, in the present embodiment, in the lower arm substrate 3A, the switching element 4 is disposed closer to the upper arm substrate 3B side than the diode element 5, and in the upper arm substrate 3B, the switching element 4 is disposed closer to the lower arm substrate 3A side than the diode element 5. The configuration of the substrates 3 of the semiconductor module 1 according to the present embodiment is realized by disposing both of a pair of substrates 3A and 3B that have an identical structure in point symmetry such that the switching elements 4 are arranged in the side of the other substrates 3.

Figure 13:
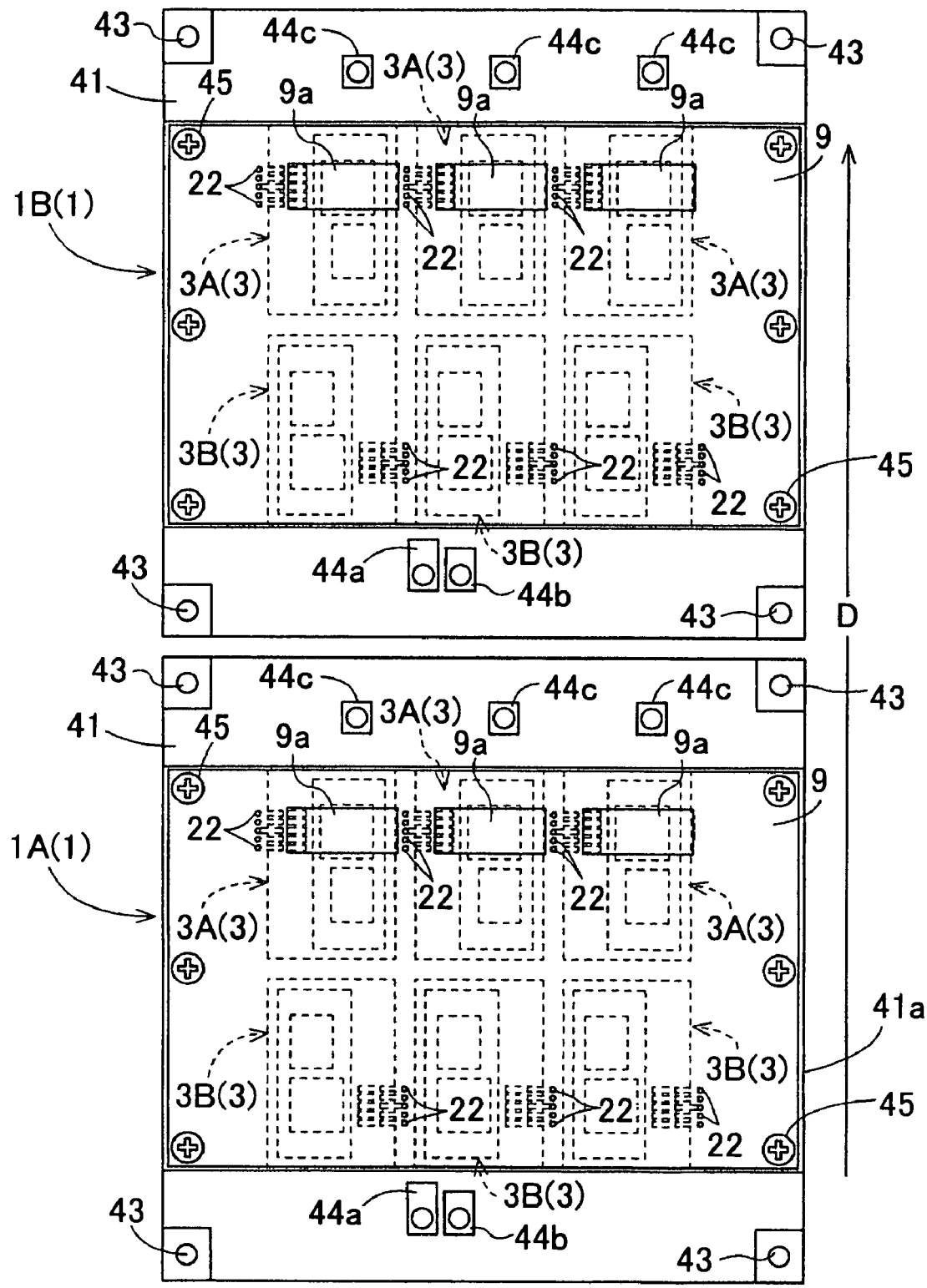
FIG. 13 is a drawing that shows an example, according to an alternative embodiment of the present invention, in which two semiconductor modules that have different heat generation amounts are disposed in series in the flow direction of the coolant.

6. Alternative Embodiments (1) When the semiconductor modules 1 that have been explained in each of the embodiments described above are used in plural combinations and when the heat generation amounts of each of the semiconductor modules 1 are different, preferably the semiconductor modules 1 having the higher heat generation amounts are disposed in sequence closer to the upstream side in the coolant flow direction D. FIG. 13 shows an example in which two semiconductor modules 1A and 1B that have different heat generation amounts are disposed in series in the coolant flow direction D. In this example, the structure of each of the semiconductor modules 1 is identical to that according to the first embodiment described above. In addition, the first semiconductor module 1A, which is arranged in the upstream side in the coolant flow direction D, has a higher heat generation amount than the second semiconductor module 1B, which is arranged in the downstream side in the coolant flow direction D. In this example, the coolant passes through the coolant flow paths 7 of the second semiconductor module 1B after passing through the coolant flow paths 7 of the first semiconductor module 1A. Due to being structured in this manner, it is possible to realize a good balance between the reduction of the cooling capacity by the coolant, whose temperature gradually increases as it flows toward the downstream side of the flow direction D, and the heat generating amounts of each of the semiconductor modules 1. Note that when the heat generation amounts of the plurality of semiconductor modules 1 differ in this manner, there is the case, for example, of a structure that is used in which the inverter circuit 11 that is structured by each of the semiconductor modules 1 drives electric machines having different outputs, and the amount of the current that flows through the switching elements 4 of each of the semiconductor modules 1 is different.

Figure 14:
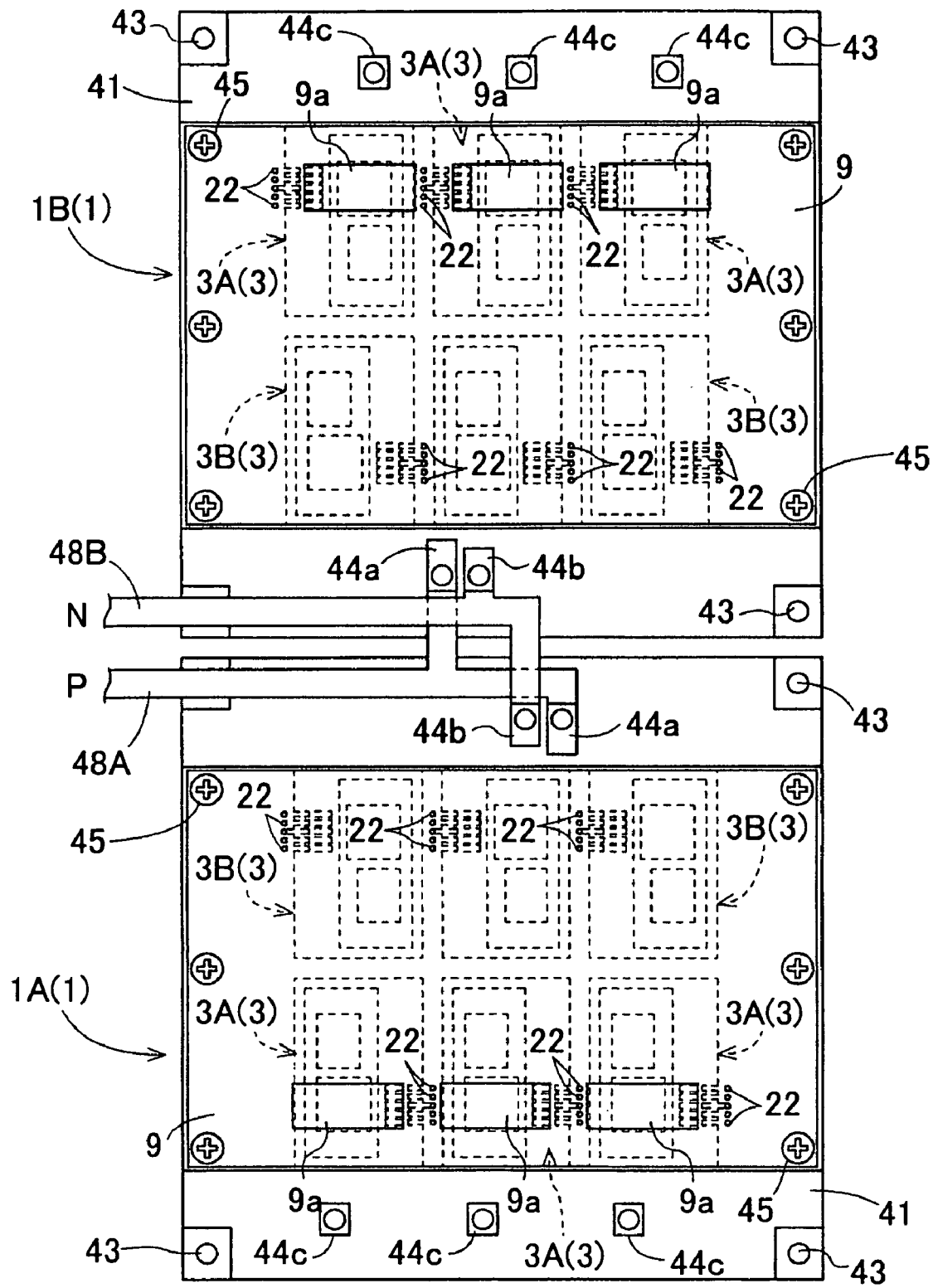
FIG. 14 is a drawing that shows an example, according to an alternative embodiment of the present invention, of the disposition of two semiconductor modules.

(2) When the semiconductor modules 1 that have been explained in each of the embodiments described above are used in a plurality of combinations of groups, preferably two semiconductor modules 1 are disposed such that the positive terminals 44a and the negative terminals 44b of the two semiconductor modules 1 are each positioned on the side near the other semiconductor module 1 where two modules are adjacent each other. FIG. 14 shows an example of such a disposition of two such semiconductor modules 1A and 1B. In this example, the structure of each of the semiconductor modules 1 is identical to that according to the first embodiment. In addition, the first semiconductor module 1A that is arranged in the lower side in FIG. 14 is oriented such that the positive terminal 44a and the negative terminal 44b thereof are positioned on the second semiconductor module 1B side that is adjacent thereto. In addition, the second semiconductor module 1B that is arranged in the upper side in FIG. 14 is oriented such that the positive terminal 44a and the negative terminal 44b thereof are positioned at the first semiconductor module 1A side that is adjacent thereto. As shown in FIG. 14, due to disposing the two semiconductor modules 1A and 1B in this manner, the positive electrode bus bar 48A and the negative electrode bus bar 48B of the two semiconductor modules 1A and 1B can each be shared, and furthermore, the positive electrode bus bar 48A and the negative electrode bus bar 48B can be disposed in parallel. In addition, because the positive electrode bus bar 48A and the negative electrode bus bar 48B are disposed in parallel in this manner, it is possible to cancel the magnetic fields that are generated around the positive electrode bus bar 48A and the negative electrode bus bar 48B due to the influence of parallel currents that flow in opposite directions through the respective positive electrode bus bar 48A and the negative electrode bus bar 48B, and it is possible to reduce the impedance of the positive electrode bus par 48A and the negative electrode bus bar 48B.

(3) In each of the embodiments described above, an explanation was provided that used as an example the case in which a cooling fluid in which ethylene glycol or the like is added to water was used as the coolant. However, the coolant in the present invention is not limited to such an example. Specifically, preferably various coolants such as a well-known liquid or gas can be used in the semiconductor module 1 according to the present invention.

(4) As a specific example of the structure that is "disposed in series in the coolant flow direction D," each of the embodiments described above was explained by providing a structure in which a direction that connects the center positions of the plurality of elements or the substrates is disposed so as to be substantially parallel to the coolant flow direction D. However, the scope included in structures that are "disposed in series in the coolant flow direction D" is not limited thereby. Specifically, even if the direction that joins the center positions of the plurality of elements or the substrates is disposed in a direction that intersects the coolant flow direction D, when the elements and at least a portion of the substrates have positional relationships that overlap each other in the perpendicular direction C, the structure that is "disposed in series in the coolant flow direction D" is included, and this structure is one preferable embodiment of the present invention.

(5) Similarly as a specific example of a structure that is "disposed by being arranged in a perpendicular direction C with respect to the coolant flow direction D," each of the embodiments described above was explained by providing a structure in which the direction that joins the center positions of the plurality of elements and the substrates is disposed so as to be substantially parallel to the perpendicular direction C. However, the scope included in structures that are "disposed by being arranged in a perpendicular direction C" is not limited thereby. Specifically, even if the direction that joins the center positions of the plurality of elements and the substrates is disposed in a direction that intersects the perpendicular direction C, when the elements and at least a portion of the substrates have positional relationships that overlap each other in the coolant flow direction D, the structure that is "disposed so as to be arranged in the perpendicular direction C" is included, and this structure is one preferable embodiment of the present invention.

(6) Each of the embodiments described above was explained by an example in which a plurality of parallel fins 8 are provided on the lower surface 2B of the base plate 2 as a parallel flow forming device. However, the specific structure of the parallel flow forming device is not limited thereby. Therefore, for example, a structure in which a plurality of fins 8 are formed on the side of the water path forming member 12 which is separate from the base plate 2, and the upper surface of each of the fins 8 abuts the base plate 2 is also an advantageous embodiment of the present invention. In addition, the number of fins 8 and the intervals there between and the like can be freely determined. In addition, it is possible to structure the parallel flow forming device by using a device other than fins. For example, it is possible to form a parallel coolant flow in a prescribed direction similarly by using a plurality of elongated through holes or grooves or the like that are provided in the base plate 2, and in this case, these through holes and grooves and the like serve as the parallel flow forming device.

(7) In addition, a structure in which the ends of the fins 8 have prescribed gaps with respect to the opposing plate member is also preferable. Specifically, each of the embodiments described above was explained by using as an example the case in which the bottom surfaces (the bottom surfaces in FIG. 2 and FIG. 3) of the fins 8, which function as the parallel flow forming device, are provided so as to be in contact with the abutting plate portion 12b of the water path forming member 12. However, preferably a structure is used in which the bottom surfaces of the fins 8 are disposed at prescribed gaps with respect to the abutting plate portion 12b. Similarly, when the fins 8 are formed on the water path forming member 12 side, preferably a structure is used in which the upper surface of the fins 8 are disposed at prescribed gaps with respect to the lower surface 2B of the base plate 2.

(8) In addition, in each of the embodiments described above, an explanation was provided using an example in which the parallel coolant flows that are formed by the parallel flow forming device are each linear. However, the parallel coolant flows that are formed by the parallel flow forming device are not limited to a linear shape, and a curved shape having a curved portion such as a wave is also one preferable embodiment of the present invention. In this case, for example, when the parallel flow forming device is made of fins 8, each of the fins 8 is formed in a curved shape such as a wave that is curved in plane view.

(9) In each of the embodiments described above, an explanation was provided for an example of the case in which the lower arm substrates 3A that are provided with the lower arm switching elements 4A are disposed closer to the downstream side in the coolant flow direction D than the upper arm substrate 3B. However, a structure in which the lower arm substrates 3A are disposed closer to the upstream side in the coolant flow direction D than the upper arm substrates 3B is also one preferable embodiment of the present invention. In this case, taking into consideration the reliability of the temperature control, a structure is also preferable in which the temperature detecting circuits 9a for the lower arm switching elements 4A are omitted and the temperature detecting circuits 9a of the upper arm switching elements 4B, which are arranged in the downstream side in the coolant flow direction D, are provided. However, this does not exclude a structure in which the temperature detecting circuits 9a of the upper arm switching elements 4B, which are arranged in the downstream side in the coolant flow direction D, are omitted and the temperature detecting circuits 9a of the lower arm switching elements 4A of the lower arm, which is arranged in the upstream side in the coolant flow direction D, are provided. In addition, it is possible to use a structure in which temperature detecting circuits 9a are provided on both the lower arm switching elements 4A and the upper arm switching elements 4B.

(10) In each of the embodiments described above, an explanation was provided that used as an example a structure in which a plurality of substrates 3 is arranged in the upper surface 2A of the base plate 2 and the coolant flow paths 7 are provided on the lower surface 2B of the base plate 2. However, the embodiments of the present invention are not limited thereby. Specifically, the orientation of the base plate 2 can be freely given, and the surface on which the plurality of substrates 3 are disposed being faced downward or sideways is also one preferable embodiment of the present invention.

(11) In the first, second, and fifth embodiments, an explanation was provided for an example of the case in which the pair of substrates 3A and 3B have completely identical structures. However, in order to realize the disposition of pairs of substrates 3A and 3B as described above, provided that at least the disposition of the switching elements 4, the diode elements 5, and the connection terminal elements 6 on each of the substrates 3 is identical, it is not necessary for the pairs of substrates 3A and 3B to have completely identical structures. Therefore, a structure in which the lower arm substrates 3A and the upper arm substrates 3B are identical in relation to the disposition of the switching elements 4, the diode elements 5, and the connection terminal areas 6 while the other structures are different, and such pairs of substrates 3A and 3B are disposed in point symmetry, is a preferable embodiment of the present invention.

(12) In each of the embodiments described above, an explanation was mainly provided of an example of the case in which the semiconductor module 1 is applied to an inverter circuit 11 or a chopper circuit. However, the scope of application of the present invention is not limited thereby, and the present invention can be advantageously applied to various types of semiconductor modules 1 that require appropriate cooling of the switching elements 4.

The present invention can be advantageously used in semiconductor modules that are provided with a base plate, a plurality of substrates that are mounted on one surface of the base plate and that are each provided with a switching element, a diode element, and a connection terminal area, and a coolant flow path that is provided so as to be in contact with the other surface of the base plate.

According to an exemplary aspect of the invention, in a structure in which the switching elements and the diode elements of the respective substrates that are mounted on one surface of a base plate are disposed in series in the coolant flow direction in coolant flow paths that are provided on the other surface of the base plate, the switching elements on a pair of substrates that are similarly disposed in series in the coolant flow direction are disposed so as to be at positions that are substantially different in the perpendicular direction of the coolant flow direction. Thus, when viewed along the parallel coolant flows in the coolant flow paths, a structure can be used in which basically the same coolant flow cools only the switching element of either one of the pair of substrates. Therefore, it is possible to cool both switching elements on the pair of substrates suitably. In other words, it is possible to suppress the reduction in cooling capacity for the switching elements on the downstream side that occurs due to a structure in which the same coolant flow, which has a temperature that has risen due to cooling the switching element of one substrate at the upstream side of the coolant flow direction, further cools the switching elements on the other substrate on the downstream side. Thus, it is possible to cool appropriately the switching elements on all of the substrates that are mounted on the one surface of the base plate. Note that a pair of substrates are structured by two substrates that form a pair at least in terms of the cooling structure.

According to an exemplary aspect of the invention, the switching elements of a pair of substrates, which are disposed in series in the coolant flow direction, are disposed at positions that are substantially different in the perpendicular direction with respect to the coolant flow direction, and it is possible for the pair of substrates to share the same structure. Therefore, it is not necessary to use a plurality of types of substrates where the dispositions of the elements and the like differ, and it is possible to suppress a rise in the manufacturing cost of the semiconductor modules because the switching elements in a pair of substrates, which are positioned in series in the coolant flow direction, are disposed at positions that substantially differ in the perpendicular direction with respect to the coolant flow direction.

According to an exemplary aspect of the invention, two switching elements that are present on the pair of substrates are disposed so as to put there between the diode elements on at least one substrate in the coolant flow direction. Thereby, the switching elements that generate the most heat can be disposed at positions that are separated from each other between a pair of substrates. It is possible to suppress the occurrence of thermal interference on the base plate due to heat that is transmitted from the switching elements on the pair of substrates. Therefore, it is possible to cool the switching elements on all of the substrates suitably.

According to an exemplary aspect of the invention, it is possible to suitably form coolant flows parallel to a direction along the plurality of fins in the coolant flow paths. In addition, because the surface area of the coolant flow paths is widened by providing the plurality of fins, it is possible to radiate the heat that is transmitted from the substrates to the base plate efficiently.

According to an exemplary aspect of the invention, it is possible to eliminate the temperature detecting device for the switching elements of the substrates that are arranged in the upstream side of the coolant flow direction. Therefore, it is possible to simplify the structure of the temperature detecting device, and it is possible to reduce the manufacturing cost of the semiconductor modules. In addition, normally the temperature of the coolant on the downstream side rises more than the upstream side in the coolant flow direction, and thus there is a high possibility that the switching elements of the substrates that are arranged in the downstream side have a higher temperature than the switching elements of the substrates that are arranged in the upstream side. Thus, even if the temperature management is carried out by using only the temperature detection results of the switching elements of the substrates that are arranged in the downstream side, there is no problem in that the temperature of the switching elements of the substrates that are arranged in the upstream side will exceed a prescribed safe operating temperature range.

According to an exemplary aspect of the invention, semiconductor modules that are provided with pairs of substrates are used singly or in plural combinations thereof, and it is possible to use these in chopper circuits or inverter circuits or the like.

According to an exemplary aspect of the invention, it is possible to structure the temperature detecting device based on the electrical potential of the ground. Therefore, it is possible to simplify the structure in comparison to a temperature detecting device that is based on the electrical power source potential, and it is possible to reduce the manufacturing costs of the semiconductor modules.

According to an exemplary aspect of the invention, all of the switching elements that structure the inverter circuit for three-phase alternating current are provided integrally on the base plate, and thus it is possible to easily structure a small and light-weight inverter circuit for three-phase alternating current by using this semiconductor module.

What is claimed is:

1. A semiconductor module comprising:
   a base plate;
   a plurality of substrates placed on one surface of the base plate, with each substrate of the plurality of substrates including a switching element, a diode element, and a connection terminal area; and
   a parallel flow forming device that forms parallel coolant flow paths that are provided so as to be in contact with the other surface of the base plate, wherein:
      the coolant flow paths are formed such that coolant flows in a coolant flow direction,
      the switching element and the diode element are disposed in series in the coolant flow direction in each of the substrates,
      the switching element and the connection terminal area are disposed at positions that differ in a perpendicular direction with respect to the coolant flow direction in each of the substrates,
      a pair of substrates of the plurality of substrates is disposed in series in the coolant flow direction,
      the switching element is arranged on a first side in the perpendicular direction for one substrate of the pair of substrates and on a second side in the perpendicular direction for the other substrate of the pair of substrates, and
      the connection terminal area is arranged on the second side in the perpendicular direction for the one substrate of the pair of substrates and on the first side in the perpendicular direction for the other substrate of the pair of substrates.

2. The semiconductor module according to claim 1, wherein the pair of substrates have an identical structure with each other and are arranged to be point symmetrical.

3. The semiconductor module according to claim 1, wherein one or both of the diode elements of the pair of substrates are arranged closer to a side that is between the pair of substrates with respect to the switching elements of the pair of substrates.

4. The semiconductor module according to claim 1, wherein the parallel flow forming device is a plurality of fins that are arranged parallel with each other along the other surface of the base plate.

5. The semiconductor module according to claim 1, further comprising:
   a temperature detecting device that detects a temperature of the switching elements of both substrates of the pair of substrates, wherein the temperature detecting device is provided for the switching element of the substrate arranged on a downstream side of the coolant flow direction.

6. The semiconductor module according to claim 1, wherein the pair of substrates is provided with one of a pair of a lower arm switching element and an upper arm switching element.

7. The semiconductor module according to claim 6, further comprising:
   a temperature detecting device that is mounted on the lower arm switching element, wherein temperature detection is carried out for temperature control of the switching elements of both substrates of the pair of substrates.

8. The semiconductor module according to claim 1, wherein the plurality of substrates includes six substrates, each pair of a lower arm switching element and an upper arm switching element of each phase forming a three-phase AC inverter circuit that is placed on the one surface of the base plate.

9. The semiconductor module according to claim 1, wherein the diode element is arranged on the first side in the perpendicular direction for the one substrate of the pair of substrates and on the second side in the perpendicular direction for the other substrate of the pair of substrates.

10. An inverter device including the semiconductor module according to claim 1.

11. A semiconductor module comprising:
   a base plate;
   a plurality of substrates placed on one surface of the base plate, with each substrate of the plurality of substrates including a switching element, a diode element, and a connection terminal area; and a parallel flow forming device that forms parallel coolant flow paths that are provided so as to be in contact with the other surface of the base plate, wherein:

the coolant flow paths are formed such that coolant flows in a coolant flow direction, the switching element and the diode element are disposed in series in the coolant flow direction in each of the substrates, the switching element and the connection terminal area are disposed at positions that differ in a perpendicular direction with respect to the coolant flow direction in each of the substrates, a pair of substrates of the plurality of substrates is disposed in series in the coolant flow direction, and the switching element for one substrate of the pair of substrates and the connection terminal area for the other substrate of the pair of substrates overlaps in the perpendicular direction.

12. The semiconductor module according to claim 11, wherein the pair of substrates have an identical structure with each other and are arranged to be point symmetrical.

13. The semiconductor module according to claim 11, wherein one or both of the diode elements of the pair of substrates are arranged closer to a side that is between the pair of substrates with respect to the switching elements of the pair of substrates.

14. The semiconductor module according to claim 11, wherein the parallel flow forming device is a plurality of fins that are arranged parallel with each other along the other surface of the base plate.

15. The semiconductor module according to claim 11, further comprising:

a temperature detecting device that detects a temperature of the switching elements of both substrates of the pair of substrates, wherein the temperature detecting device is provided for the switching element of the substrate arranged on a downstream side of the coolant flow direction.

16. The semiconductor module according to claim 11, wherein the pair of substrates is provided with one of a pair of a lower arm switching element and an upper arm switching element.

17. The semiconductor module according to claim 16, further comprising:

a temperature detecting device that is mounted on the lower arm switching element, wherein temperature detection is carried out for temperature control of the switching elements of both substrates of the pair of substrates.

18. The semiconductor module according to claim 11, wherein the plurality of substrates includes six substrates, each pair of a lower arm switching element and an upper arm switching element of each phase forming a three-phase AC inverter circuit that is placed on the one surface of the base plate.

19. The semiconductor module according to claim 11, wherein the diode element for the one substrate of the pair of substrates does not overlap the diode element for the other substrate of the pair of substrates.

20. An inverter device including the semiconductor module according to claim 11.

* * * * *